United States Patent [19]

Hsu et al.

[11] Patent Number: 6,010,928
[45] Date of Patent: Jan. 4, 2000

[54] HIGH DENSITY TRANSISTOR COMPONENT AND ITS MANUFACTURING METHOD

[75] Inventors: Chen-Chung Hsu, Taichung; Larry Lin, Hsinchu, both of Taiwan

[73] Assignee: United Microelectronics Corp., Hsinchu, Taiwan

[21] Appl. No.: 09/063,302

[22] Filed: Apr. 21, 1998

Related U.S. Application Data

[62] Division of application No. 08/917,709, Aug. 26, 1997, Pat. No. 5,959,331.

[30] Foreign Application Priority Data

May 3, 1997 [TW] Taiwan .................................. 86105898

[51] Int. Cl.[7] ...................... H01L 21/8238; H01L 21/336
[52] U.S. Cl. .......................... 438/221; 438/222; 438/296; 438/301
[58] Field of Search ................................... 438/221, 222, 438/296, 301

[56] References Cited

U.S. PATENT DOCUMENTS 5,055,427 10/1991 Haskell .
5,273,921 12/1993 Neudeck et al. .
5,289,027 2/1994 Terrill et al. .
5,627,097 5/1997 Venkatesan et al. .

Primary Examiner—John F. Niebling
Assistant Examiner—Ron Pompey
Attorney, Agent, or Firm—Finnegan, Henderson, Farabow, Garrett & Dunner, L.L.P.

[57] ABSTRACT

A high density transistor component and its manufacturing method which includes the steps of forming a pad oxide layer above a silicon substrate, forming a dielectric layer above the pad oxide layer, and growing an epitaxial silicon layer above the pad oxide layer covering the pad oxide layer as well as the dielectric layer. Source/drain regions including the heavily doped source/drain and the lightly doped source/drain are formed in the epitaxial silicon layer, and a gate terminal region composed from an assembly of a gate oxide layer, a gate terminal and two spacers is formed above the epitaxial silicon layer. The channel is located in the spatial location between the dielectric layer, the gate region and the source/drain regions.

11 Claims, 8 Drawing Sheets

HIGH DENSITY TRANSISTOR COMPONENT AND ITS MANUFACTURING METHOD

This is a division of application Ser. No. 08/917,709, filed Aug. 26, 1997, now U.S. Pat. No. 5,959,331.

BACKGROUND OF THE INVENTION

1. Field of Invention

This invention relates in general to a transistor component of an integrated circuit, and more particularly to a type of high density transistor component and its manufacturing method.

2. Description of Related Art

Most metal-oxide-semiconductor (MOS) transistors consists of a gate oxide layer, a gate terminal and ion implanted source/drain regions. In order to increase the level of integration for integrated circuits so as to attain the sub-micron manufacturing realm, the component dimensions and hence the transistor channel length has to be reduced, thereby generating undesirable short channel effects. Furthermore, when the transistor channel length is reduced, as a result of an increase in the horizontal electric filed inside the channel, the electrons in the channel near the drain end will be greatly accelerated by the high electric field there to an energy level beyond normal thermal equilibrium, thereby producing numerous hot electrons. Carrier multiplication caused by the bombardment by these hot electrons will damage the gate oxide layer leaving a trail of electrons trapped inside the gate terminal, which will lead to component ageing and related reliability deterioration resulting in electron punch through phenomenon.

For a better understanding of the electron punch through phenomenon, refer to FIG. 1. FIG. 1 shows a cross-sectional view of a conventional lightly doped drain (LDD) transistor component. The lightly doped drain transistor component is formed by defining a component region above a silicon substrate 10 followed by forming a gate oxide layer 11, a gate terminal 12 and spacers 14 above the component region. Then, two ion implantations are performed utilizing the spacers 14 to form the lightly doped source/drain regions 13 and the heavily doped source/drain regions 15 respectively. However, this type of conventional manufacturing method can no longer reduce the overall channel length any further, and therefore it is difficult using this conventional method to further increase the density of integrated circuits. It is therefore an object of this invention to provide our improved transistor component with respect to areas such as short channel effects, hot electron effects and the reduction of the channel length, thereby producing high density integrated circuits as well as lowering manufacturing cost.

SUMMARY OF THE INVENTION

The invention provides a high-density transistor component, comprising a semiconductor substrate, an epitaxial silicon layer formed above the substrate, a gate terminal formed above the silicon layer, and two source/drain regions, one on each side of the gate terminal in the silicon layer, forming a channel region between the two source/drain regions. The transistor component also comprises a dielectric layer formed underneath the channel region.

In another aspect, the invention provides a method for manufacturing a high-density transistor component. The method includes the steps of providing a semiconductor substrate, forming a dielectric layer above the semiconductor substrate, and forming an epitaxial silicon layer above and on two sides of the dielectric layer. The method further includes the steps of forming a gate terminal layer above the epitaxial silicon layer; and forming two source/drain regions, one on each side of the gate terminal in the epitaxial silicon layer, such that a channel region is formed in the space between the two source/drain regions and underneath the dielectric layer.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENTS

First Preferred Embodiment

Figure 1:
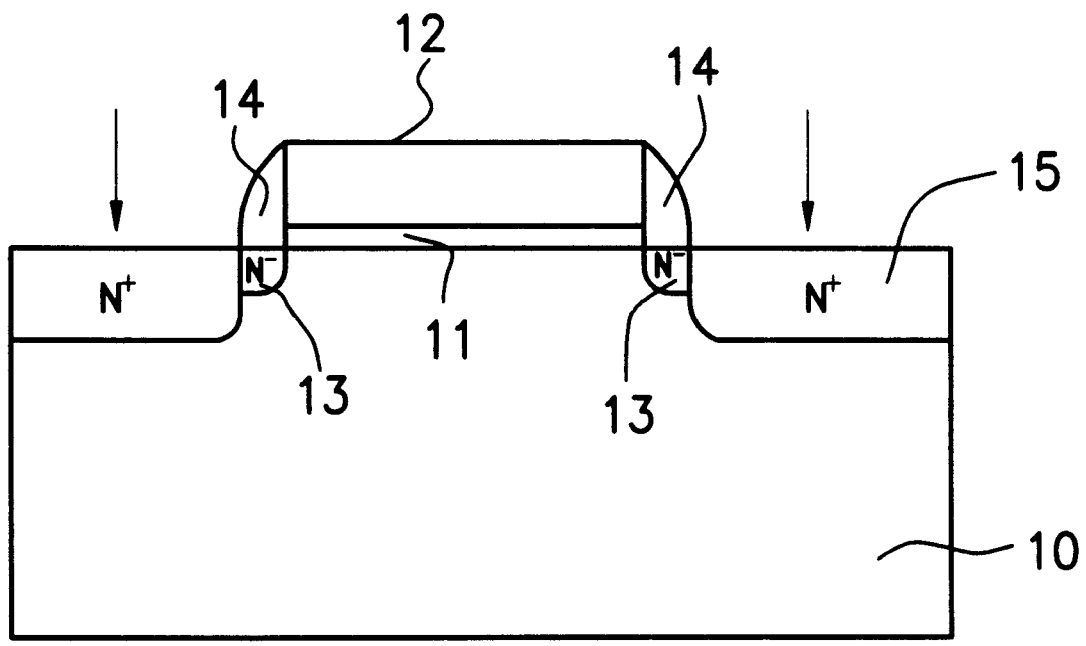
FIG. 1 shows a cross-sectional view of a conventional lightly doped drain transistor component.
Figure 2A:
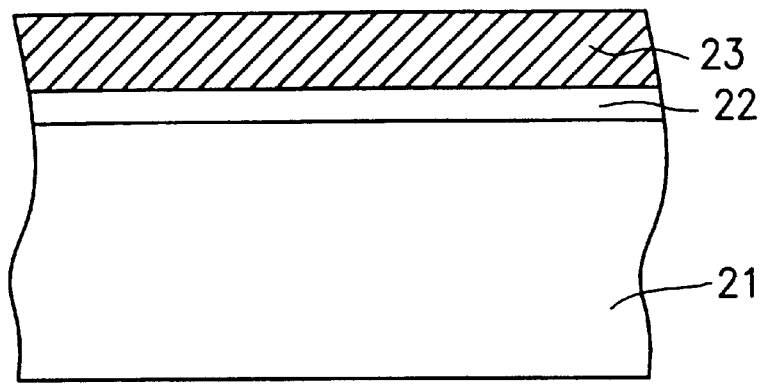
FIGS. 2A through 2H are a series of cross-sectional views showing the progression of manufacturing steps for making a high density transistor component according to a first preferred embodiment of this invention.

Referring to FIG. 2A, a semiconductor substrate 21, after appropriate cleaning, is placed inside a heating pipe, and then a layer of pad oxide 22 with a thickness of about 500~1000 Å is formed on the surface of the semiconductor substrate 21 by a thermal oxidation method in an atmosphere of oxygen. Immediately thereafter, a chemical vapor deposition (CVD) method is used to deposit a dielectric layer 23 with a thickness of about 2000~4000 Å above the pad oxide layer 22. The dielectric layer 23 can be made from, for example, silicon nitride ($Si_3N_4$).

Figure 2B:
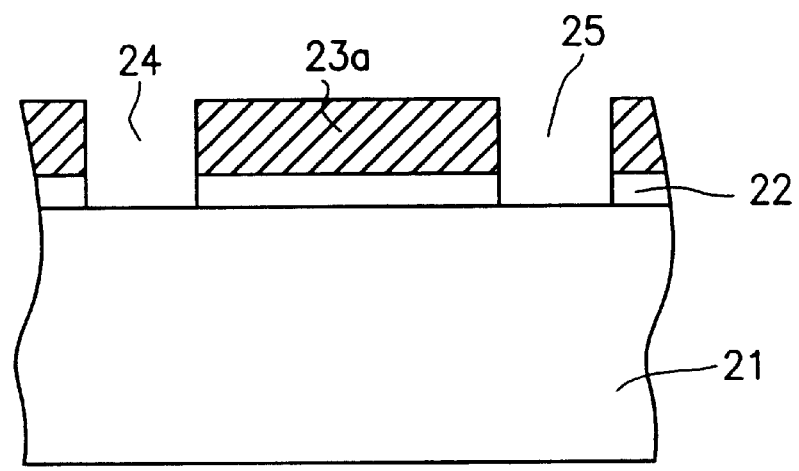
Figure 2C:
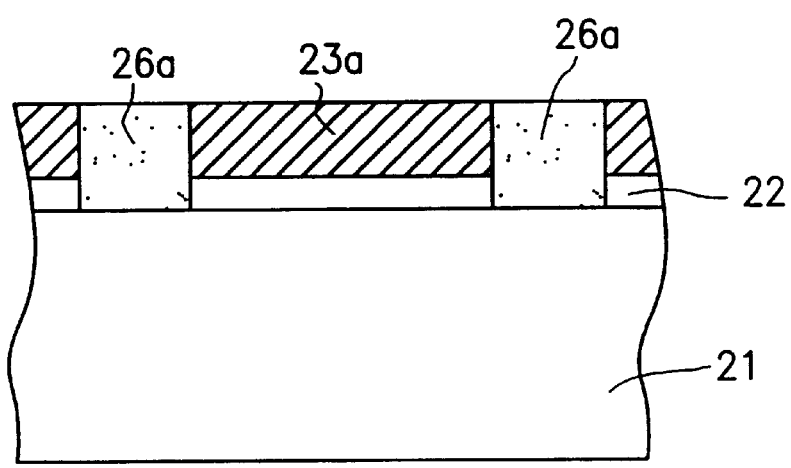

Referring next to FIG. 2B, the dielectric layer 23 and the pad oxide layer 22 are dry etched through a mask until the surface of the semiconductor substrate 21 is reached, forming trenches 24 and 25 as well as a dielectric layer 23a. Then, silicon oxide is used to fill up the trenches 24 and 25 to form isolating oxide layers 26a and 26b, and subsequently, a chemical-mechanical polishing (CMP) method is used to polish the surface of the in filled isolating oxide layers 26a and 26b such that the isolating oxide layers 26a and 26b as well as the dielectric layer 23 are all at the same surface level eventually. Thus a shallow trench isolation structure, as shown in FIG. 2C, is formed.

Figure 2D:
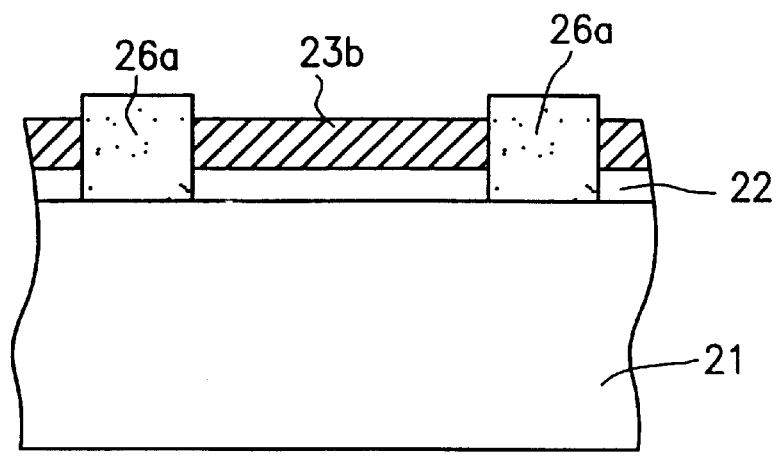

Thereafter, a thickness of about 500~1000 Å is etched away from the dielectric layer 23a to form a dielectric layer 23b with the structure as shown in FIG. 2D.

Figure 2E:
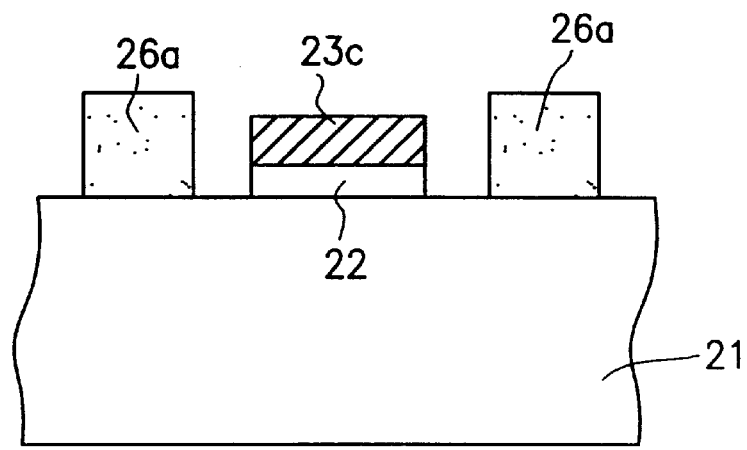

Then, a reactive ion etching (RIE) technique is used to etch the dielectric layer 23b and the pad oxide layer 22 forming a dielectric layer 23c. Next, a channel is defined whose length is, for example, smaller than 0.18 μm thereby forming a structure as shown in FIG. 2E.

Figure 2F:
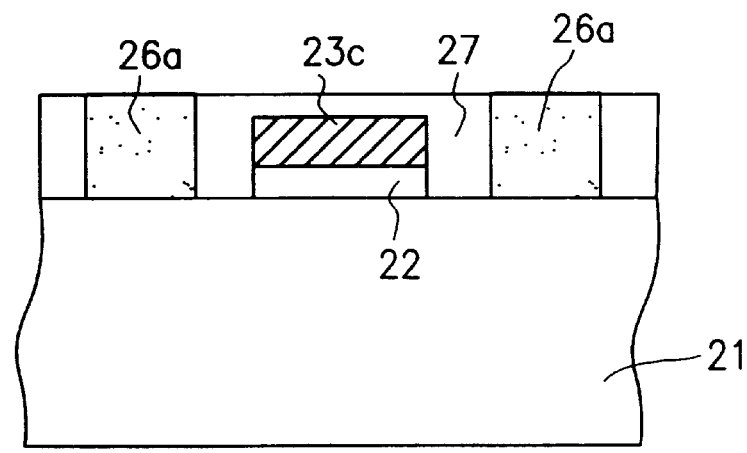

Referring next to FIG. 2F, at a high temperature, an epitaxial silicon layer 27 is deposited followed by a chemical-mechanical polishing operation to make the epitaxial silicon layer 27, the oxide layers 26a and 26b all at the same surface level.

Figure 2G:
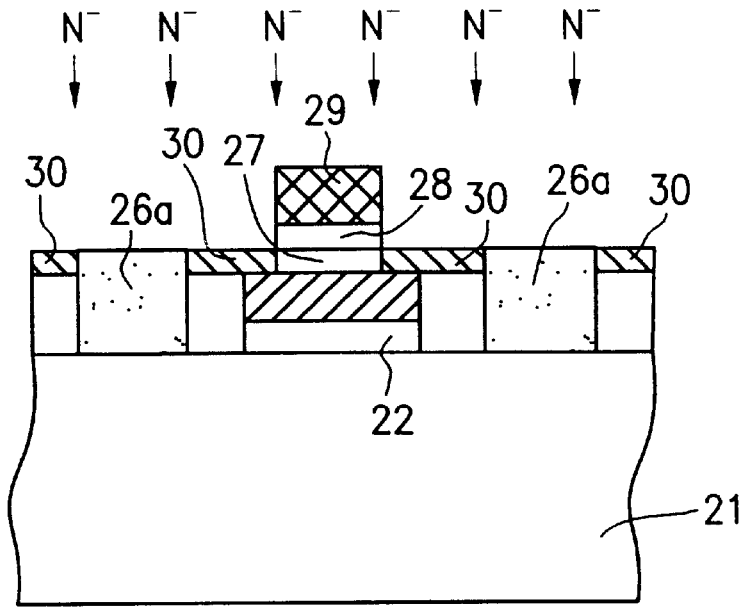

In the subsequent step, the wafer is put inside an oxidation pipeline, and a gate oxide layer 28 is formed by a dry oxidation method. Thereafter, a polysilicon layer is deposited, then doped, and finally using photolithographic and etching processes to form a gate terminal 29. Next, N- ions are implanted forming lightly doped source/drain regions 30 with a structure as shown in FIG. 2G.

Figure 2H:
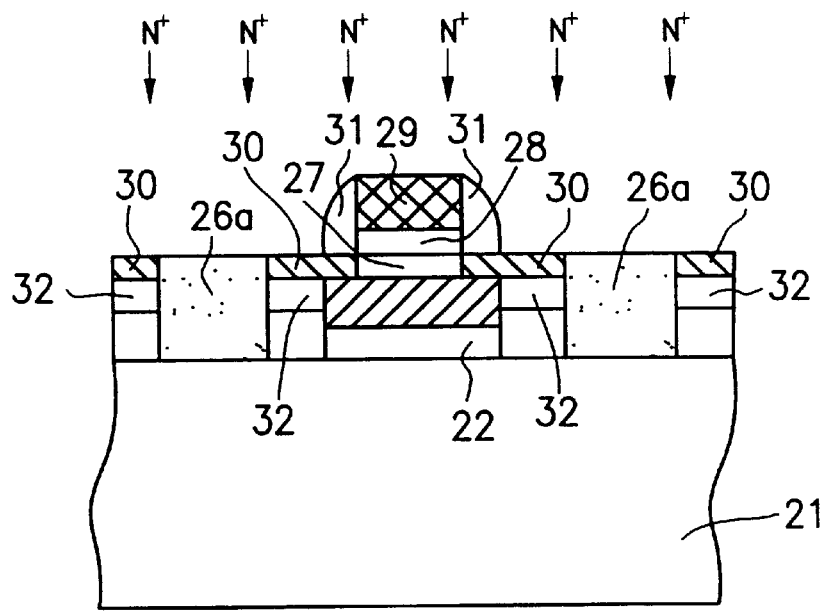
Figure 2I:
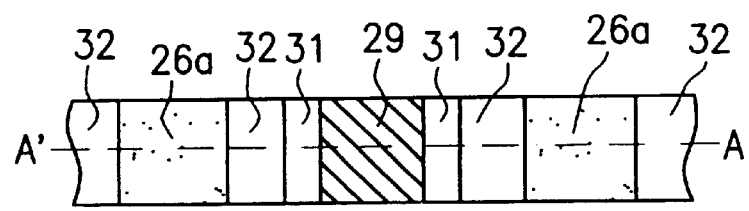
FIG. 2I shows a top view of a high density transistor component according to a first preferred embodiment of this invention.

Finally, referring to FIG. 2H, an oxide layer is formed above the gate terminal 29 followed by an etch-back operation to form spacers 31 on the sidewalls of the gate terminal 29. Subsequently, $N^+$ ions are implanted forming heavily doped source/drain regions 32. FIG. 2I shows a top view of a high density transistor component according to a first preferred embodiment of this invention, and that FIG. 2H is a cross-sectional view along line A—A of FIG. 2I.

Subsequent processes are the same as in a conventional manufacturing method and are familiar to those skilled in the semiconductor art these subsequent steps are not of central importance to the working of the present invention. Therefore detailed descriptions are omitted here.

Second Preferred Embodiment

Figure 3A:
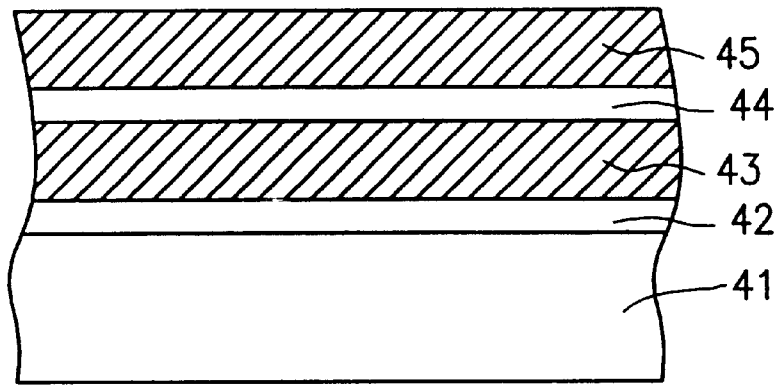
FIGS. 3A through 3G are a series of cross-sectional views showing the progression of manufacturing steps for making a high density transistor component according to a second preferred embodiment of this invention.

First, referring to FIG. 3A, after appropriate cleaning, a semiconductor substrate 41 is placed inside a heating pipeline, and then a layer of pad oxide 42 with a thickness of about 300~1000 Å is formed on the surface of the wafer using a thermal oxidation method in an oxygen atmosphere. Immediately thereafter, a chemical vapor deposition (CVD) method is used to deposit a dielectric layer 43 with a thickness of about 1500~3000 Å above the pad oxide layer 42. Similarly, a second pad oxide layer 44 and a second dielectric layer 45 are sequentially formed next. The first dielectric layer 43 and the second dielectric layer 45 can be made from material such as silicon nitride ($Si_3N_4$).

Figure 3B:
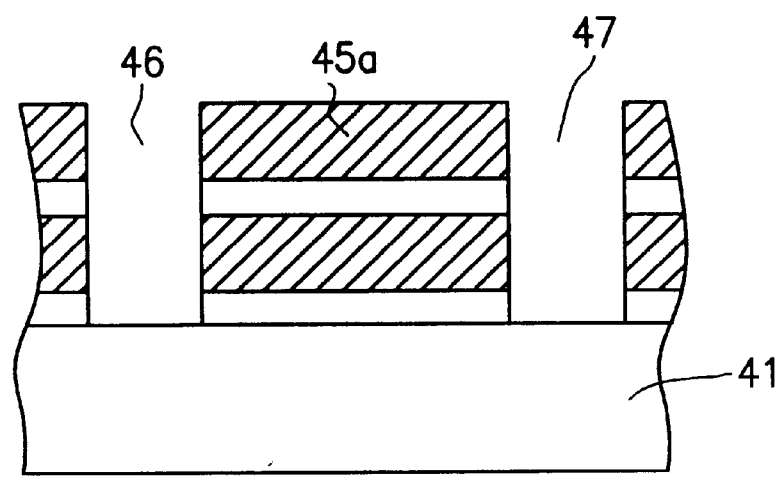

Referring next to FIG. 3B, a dry etching method is used to etch, in sequence, the second dielectric layer 45, the second pad oxide layer 44, the first dielectric layer 43 and the first pad oxide layer 42 until the silicon substrate surface 41 is reached forming two trenches 46 and 47.

Figure 3C:
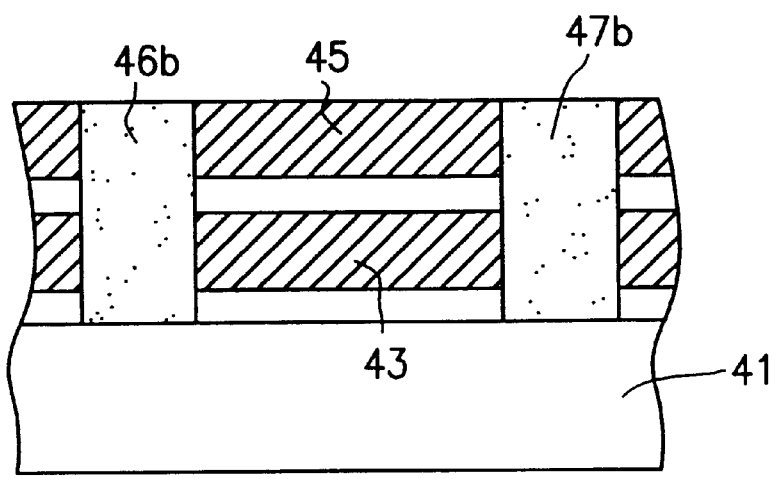

Thereafter, silicon oxide is formed filling the trenches 46 and 47 and forming isolating oxide layers 46b and 47b. Subsequently, a chemical-mechanical polishing (CMP) method is used to polish the surfaces of the isolating oxide layers 46b and 47b so that the surfaces of the isolating oxide layers 46b and 47b as well as the second dielectric layer 45 are all at the same surface level, thereby forming a shallow trench isolation structure as shown in FIG. 3C.

Figure 3D:
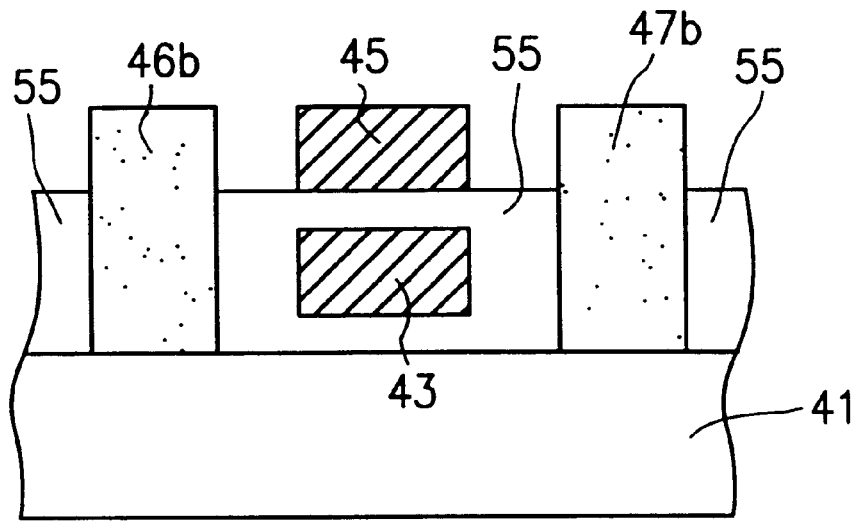

Referring next to FIG. 3D, a channel is defined whose length is, for example, smaller than 0.18 μm. Then, a dry etching method is again used to etch sequentially the second dielectric layer 45, the second pad oxide layer 44, the first dielectric layer 43 and the first pad oxide layer 42 until the surface of the semiconductor substrate 41 is reached. Thereafter, a wet etching method is used to etch out the first pad oxide layer 42 and the second pad oxide layer 44 inside the channel. Next, at a high temperature, an epitaxial silicon layer 55 is deposited filling up the channel interior as well. FIG. 3H shows a top view of FIG. 3D, and that FIG. 3D is a cross-sectional view along line A—A of FIG. 3H.

Figure 3E:
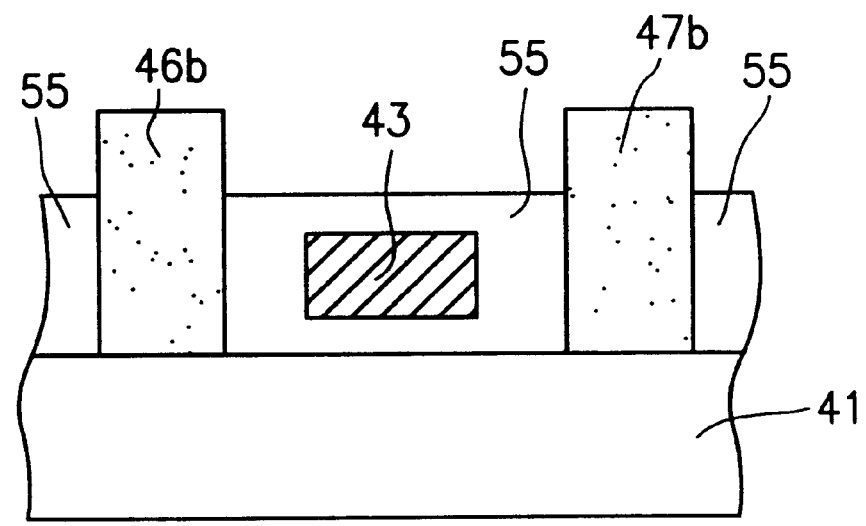

Referring next to FIG. 3E, a reactive ion etching (RIE) technique is used to etch away the second dielectric layer 45 above the epitaxial silicon layer 55. FIG. 3I shows a top view of FIG. 3E, and that FIG. 3E is a cross-sectional view along line A—A of FIG. 3I.

Figure 3F:
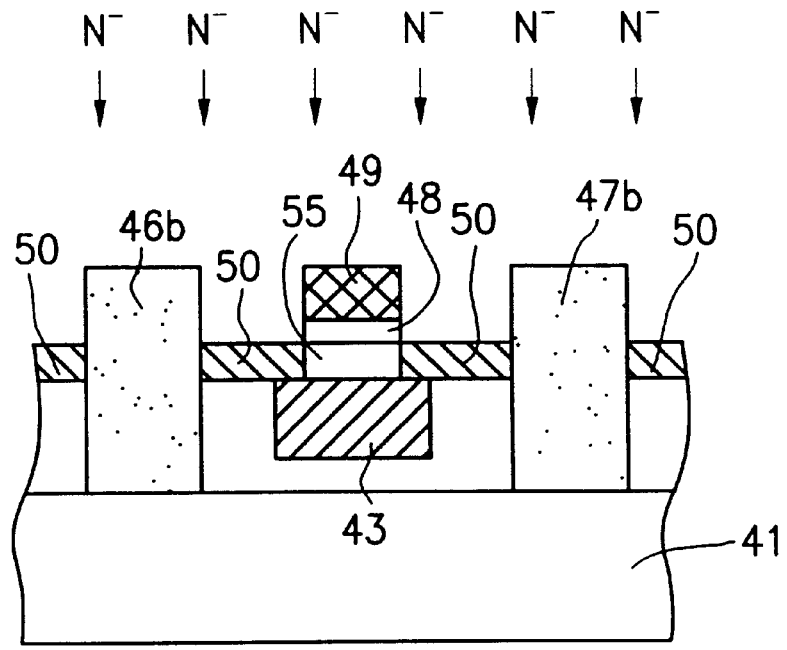

In the subsequent step, illustrated in FIG. 3F, a dry oxidation method is used to grow a gate oxide layer 48, then a doped polysilicon layer is deposited followed by using photolithographic and etching processes to form the gate oxide layer 48 and the polysilicon gate terminal 49 assembly. Thereafter, N- ions are implanted forming lightly doped source/drain regions 50 with a structure as shown in FIG. 3F.

Figure 3G:
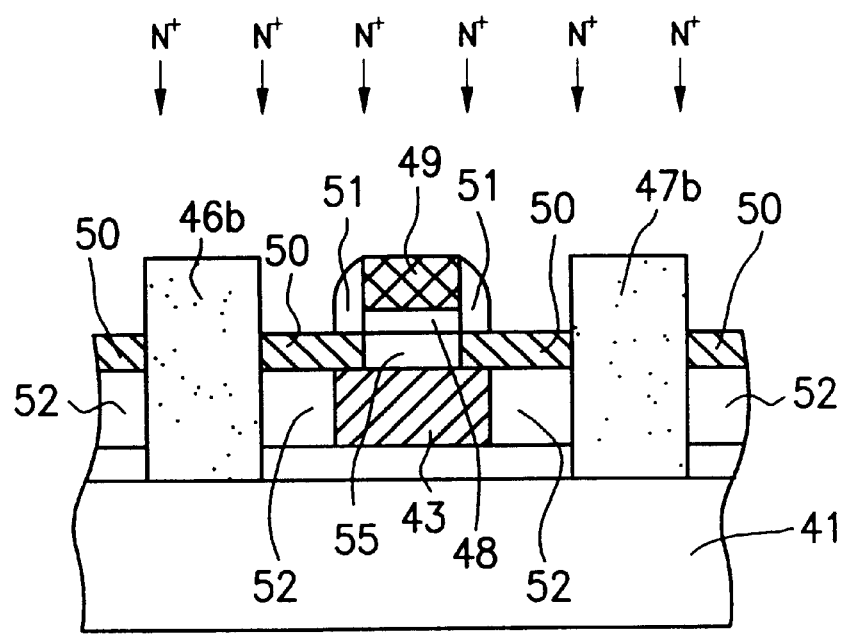
Figure 3H:
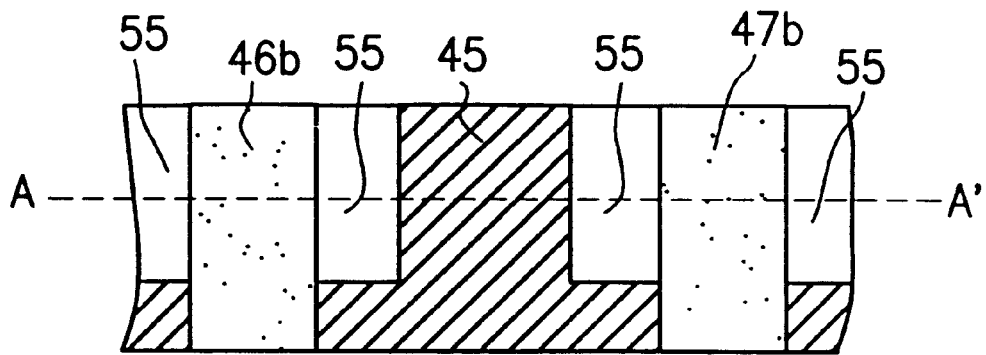
FIG. 3H shows a top view of FIG. 3D.
Figure 3I:
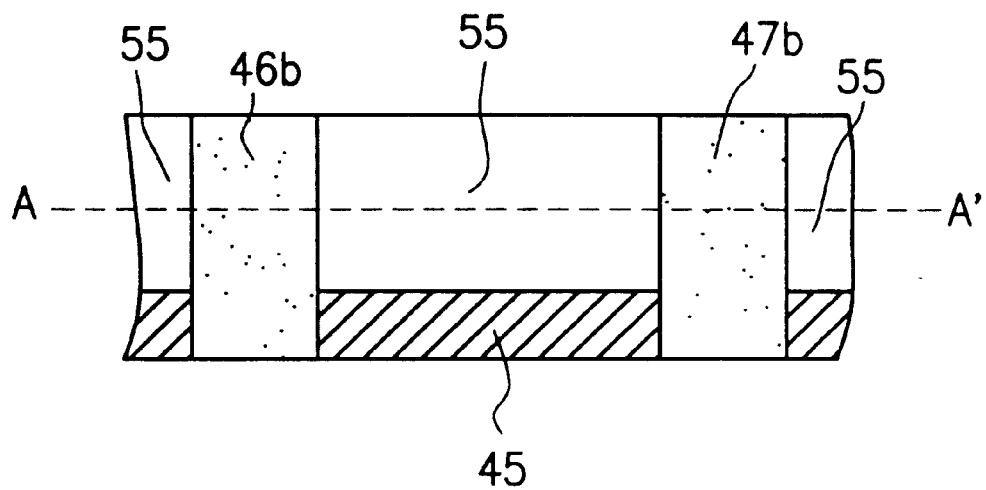
FIG. 3I shows a top view of FIG. 3E.

Finally, referring to FIG. 3G, an oxide layer is formed above the gate terminal 49 followed by an etch-back operation to form spacers 51 on the sidewalls of the gate terminal 49. Subsequently, $N^+$ ions are implanted forming heavily doped source/drain regions 52.

Subsequent processes are the same as in a conventional manufacturing method and should be familiar to those who have an understanding in the semiconductor technologies, besides, they are not of central importance to the working of the present invention, therefore detailed descriptions are omitted here.

In the foregoing manufacturing method, owing to the use of a dielectric layer, electron punch through effects are minimized, and deep submicron components, for example, those components with a channel length smaller than 0.18 μm, can be fabricated. Additionally, dislocation of $N^+$ ions by diffusion is minimized, and therefore it is quite possible to reduce the channel length of the transistor component. Moreover, the present manufacturing method for transistor components offer improvements to the source/drain region concentration, therefore the resistance there is lower. Furthermore, the manufacturing processes used for forming the high density transistor component are very much the same as in the shallow trench isolation processes now in use for the fabrication of 0.25 μm and lower channel length transistors, hence integrated circuit density can be further increased with a subsequent lowering of production cost.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A method for manufacturing a high density transistor component comprising the steps of:

(a) providing a semiconductor substrate;

(b) forming a dielectric layer above the substrate;

(c) forming an epitaxial silicon layer above and on two sides of the dielectric layer;

(d) forming a gate terminal layer above the silicon layer; and (e) forming source/drain regions, on each side of the gate terminal in the silicon layer, the source/drain regions defining a channel region formed in the space between the source/drain regions and underneath the dielectric layer, wherein the dielectric layer in the step (b) is formed by the steps of:

forming a pad oxide layer above the silicon substrate;
   forming a silicon nitride layer above the pad oxide layer;
   patterning the silicon nitride layer and the pad oxide layer to form isolating trenches;
   forming isolating oxide layers in the isolating trenches;
   etching the silicon nitride layer to reduce thickness thereof; and
   patterning the residual silicon nitride layer and pad oxide layer.

2. A method according to claim 1, wherein the method for forming the isolating oxide layer further comprises of the following steps:
   depositing a silicon dioxide layer in the isolating trenches and above the silicon nitride layer; and
   using a chemical-mechanical polishing method to polish the silicon dioxide layer until the silicon nitride layer is exposed.

3. A method according to claim 1, wherein the thickness of the pad oxide layer is about 2000~4000 Å.

4. A method according to claim 2, wherein the residual thickness of the silicon nitride layer is about 500~1000 Å.

5. A method according to claim 2, wherein step (c) comprises the substeps:
   growing an epitaxial silicon layer above the semiconductor substrate; and
   using a chemical-mechanical polishing method to polish the epitaxial silicon layer until it is almost at the same surface level as the silicon dioxide layer.

6. A method according to claim 1, wherein the source/drain regions have a lightly doped drain structure.

7. A method according to claim 1, wherein the gate terminal forming step comprises forming a stacked gate oxide layer and a polysilicon layer as an assembly.

8. A method according to claim 1, wherein the channel length is smaller than about 0.18 $\mu$m.

9. A method according to claim 8, wherein in steps (b) and step (c), comprises of the following substeps:
   forming sequentially a first pad oxide layer, a first silicon nitride layer, a second pad oxide layer and a second silicon nitride layer above the semiconductor substrate;
   patterning the first and the second silicon nitride layers and the pad oxide layers to form isolating trenches;
   forming isolating silicon oxide layers in the isolating trenches;
   further defining the first and the second silicon nitride layers and the pad oxide layers to form a channel of the desired length;
   removing the first and the second pad oxide layer along the channel region locations;
   growing an epitaxial silicon layer above the silicon substrate that also back fills into the space between the first and the second silicon nitride layers; and
   removing the second silicon nitride layer leaving only the residual first silicon nitride layer behind as the dielectric layer.

10. A method according to claim 9, wherein the step of forming the isolating oxide layer comprises the following substeps:
    depositing a silicon dioxide layer into the isolating trenches and above the silicon nitride layer; and
    using a chemical-mechanical polishing method to polish the silicon dioxide layer until the silicon nitride layer is exposed.

11. A method according to claim 9, wherein the thickness of the first and the second pad oxide layers are both about 300~1000 Å, and the thickness of the first and the second silicon nitride layers are both about 1500~3000 Å.

* * * * *